(12) United States Patent  
Morovic et al.

(10) Patent No.: US 11,298,883 B2  
(45) Date of Patent: Apr. 12, 2022

(54) DETERMINING PROPERTY MAPPING RESOURCES WITH PROPERTY CONSTRAINTS IN AN ADDITIVE MANUFACTURING

(71) Applicant: HEWLETT-PACKARD DEVELOPMENT COMPANY, L.P., Houston, TX (US)

(72) Inventors: Peter Morovic, Sant Cugat del Valles (ES); Jan Morovic, Essex (GB); Ingeborg Tastl, Palo Alto, CA (US); Melanie M. Gottwals, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 919 days.

(21) Appl. No.: 16/076,216

(22) PCT Filed: Apr. 25, 2017

(86) PCT No.: PCT/US2017/029439  
§ 371 (c)(1),  
(2) Date: Aug. 7, 2018

(87) PCT Pub. No.: WO2018/199935  
PCT Pub. Date: Nov. 1, 2018

(65) Prior Publication Data  
US 2021/0197486 A1     Jul. 1, 2021

(51) Int. Cl.  
*B33Y 50/02* (2015.01)  
*B29C 64/393* (2017.01)  
(Continued)

(52) U.S. Cl.  
CPC ............ *B29C 64/393* (2017.08); *B33Y 10/00* (2014.12); *B33Y 50/02* (2014.12); *G05B 15/02* (2013.01); *G06F 30/17* (2020.01)

(58) Field of Classification Search  
CPC ...................................................... B33Y 50/02  
(Continued)

(56) References Cited

U.S. PATENT DOCUMENTS 5,956,157 A     9/1999   Tai  
9,794,444 B2 *   10/2017   Morovic ................ H04N 1/644  
(Continued)

FOREIGN PATENT DOCUMENTS

CN         103802238 A     5/2014  
WO       2016173630 A1    11/2016

OTHER PUBLICATIONS

Brunton et al., "Pushing the Limits of 3D Color Printing: Error Diffusion with Translucent Materials", ACM Transactions on Graphics, vol. 35, No. 1, Article 4, Retrieved from Internet: https://arxiv.org/pdf/1506.02400.pdf, Dec. 2015, 15 pages.

*Primary Examiner* — Suresh Suryawanshi  
(74) *Attorney, Agent, or Firm* — HP Inc. Patent Department

(57) ABSTRACT

In an example, a method includes receiving, at a processor, a plurality of property parameter sets representing attainable property combinations in additive manufacturing and being associated with print material description. A constraint of a first property of the property parameter sets may also be received and a hull of a property mapping resource for use in determining additive manufacturing instructions for generating an object in which the first property meets the received constraint may be determined.

20 Claims, 4 Drawing Sheets

(51) Int. Cl.
  *B33Y 10/00* (2015.01)
  *G06F 30/17* (2020.01)
  *G05B 15/02* (2006.01)
(58) Field of Classification Search
  USPC .......................................................... 700/118
  See application file for complete search history.

(56) References Cited

U.S. PATENT DOCUMENTS

| | | |
|---|---|---|
| 2010/0007692 A1 | 1/2010 | Vanmaele et al. |
| 2012/0321180 A1 | 12/2012 | Friedhoff |
| 2014/0046469 A1 | 2/2014 | Bickel et al. |
| 2015/0142159 A1 | 5/2015 | Chang |
| 2015/0278414 A1 | 10/2015 | Zhou et al. |
| 2018/0086045 A1* | 3/2018 | Morovic ................. B33Y 50/02 |
| 2019/0009473 A1* | 1/2019 | Morovic ................. B33Y 10/00 |
| 2019/0152156 A1* | 5/2019 | Morovic ............... B29C 64/386 |

* cited by examiner

DETERMINING PROPERTY MAPPING RESOURCES WITH PROPERTY CONSTRAINTS IN AN ADDITIVE MANUFACTURING

BACKGROUND

Three-dimensional objects generated by an additive manufacturing process may be formed in a layer-by-layer manner. In one example of additive manufacturing, an object is generated by solidifying portions of layers of build material. In examples, the build material may be in the form of a powder, fluid or sheet material. The intended solidification and/or physical properties may be achieved by printing an agent onto a layer of the build material. Energy may be applied to the layer and the build material on which an agent has been applied may coalesce and solidify upon cooling. In other examples, chemical binding agents may be used to solidify a build material. In other examples, three-dimensional objects may be generated by using extruded plastics or sprayed materials as build materials, which solidify to form an object.

Some printing processes that generate three-dimensional objects use data generated from a model of a three-dimensional object. This data may, for example, specify the locations at which to apply an agent to the build material, or where a build material itself may be placed, and the amounts to be placed. The data may be generated from a representation of an object to be printed.

BRIEF DESCRIPTION OF DRAWINGS

Non-limiting examples will now be described with reference to the accompanying drawings, in which.

DETAILED DESCRIPTION

Figure 1:
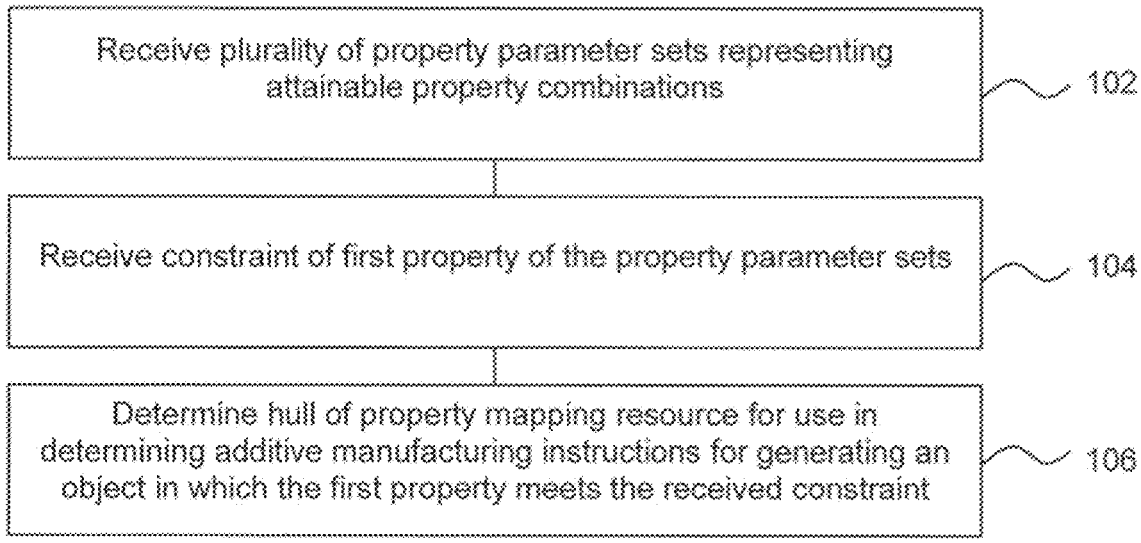
FIGS. 1 and 2 are flow charts of example methods for defining an N-dimensional hull.

Some examples described herein provide an apparatus and a method for processing data relating to a three dimensional object and/or for generating data that may be used to produce a three dimensional object. In some examples, arbitrary three dimensional content with a variety of specified object properties is processed. These object properties may comprise appearance properties (color, transparency, glossiness, etc.), conductivity, density, porosity and/or mechanical properties such as strength.

In some examples herein, three-dimensional space may be thought of in terms of 'voxels', i.e. three-dimensional pixels, wherein each voxel represents a discrete volume. In data modelling a three dimensional object, a voxel at a given location may be associated with least one characteristic. For example, it may represent a portion of the object which is intended to be empty, or to have a particular color or to comprise a particular material, or a particular object property, or the like. The voxels may have the same shape (for example, cubic or tetrahedral), or may differ in shape and/or size.

Some examples herein refer to property gamuts. A property gamut may describe a predetermined range of combination of properties in an object. In some examples all the combination of properties which are included in the gamut meet certain criteria. Therefore, while other combinations of properties may be possible, they may be excluded from (or lie outside) a gamut.

For example, considering color (although, as is noted below, color is just one class of property, and the principles set out herein may apply more generally to mapping between property spaces), there may be a source color space which is independent of a proposed object generation apparatus. For example the source color space may be defined, for example in relation to RGB or sRGB values, or which uses an International Commission on Illumination (CIE) color model. Other color space models include Hue-Saturation-Value (HSV), Hue-Saturation-Lightness (HSL), or the like.

An object generation apparatus color space may be defined with reference to at least one print agent (for example, colorants such as inks and toners, which in some examples may function as fusing agents) of an object generation apparatus. The object generation apparatus may for example be a specific object generation apparatus, or a class of object generation apparatus. For example, the object generation apparatus may be an object generation apparatus which uses Cyan. Yellow, Magenta and Black print agents in order to provide a color, which are associated with a CYMK color space. In some examples, the object generation apparatus color space may be described in the form of n-dimensional vectors, where n is the number of print agents (e.g. inks) used by the object generation apparatus and the vector components represent quantities of each print agent available in the color object generation apparatus. In other examples, the vectors may comprise combinations of print agents (and therefore the number of dimensions of such a vector may be greater than the number of printed agents). In some examples, the object generation apparatus color space may be defined in terms of print material volume coverage (Mvoc) vectors, as is described in greater detail below.

In such an example, there may be predetermined mappings which map between the colors of a source color spare into print material volume coverage vectors, and the mappings may be used to determine instructions to print an object. In examples where a color in the source color space is not represented in the object generation apparatus color space, it may for example be mapped to the closest available color, such as color on the surface or hull of the gamut enclosing the object generation apparatus color space.

While color has been used as the example above, the principle extends to other properties: for example, the break strength, resiliency, conductivity or any other property of interest. In some examples, such properties may be measured from a test object. This may then lead to a set of explicit mappings between multi-dimensional property spaces, where the properties may be any combination of properties, and where the properties may be described in one space in a device non-specific manner and in another space in terms of print material combinations to provide the properties.

In some examples, an explicit set of mappings may be characterised by measuring properties (e.g. color, strength, conductivity, density, resilience, etc.) of a plurality of generated test objects. The properties of the objects may be measured and stored such that a relationship, or mapping, between a printed property set and the materials used in generating the objects can be established.

In some examples, these explicit mappings are used to define property gamuts. Where a combination of properties is specified for an object which has not been explicitly tested, interpolation may be used to estimate the print material, or combination of print materials, which is likely to result in this combination of properties. This may for example be determined by considering two print material descriptions which have been tested and shown to provide relatively similar properties, and determining an intermediate print material description.

In some examples, the external hull of a gamut is determined from the tested combinations of print material which result in the 'most extreme' combinations of properties (where most extreme may comprise the strongest and the weakest, the most and least colourful, the strongest colourful object, and so on). In some examples, a convex gamut may be defined. When compared to gamuts exhibiting concavities, convex gamuts may provide more consistent results when using interpolation.

In some examples, a print material coverage representation defines print material data, for example detailing the amount of print materials (such as agent(s) to be deposited onto a layer of build material, or in some examples, build materials themselves), and, if applicable, their combinations. In some examples, this may be specified as a proportional volume coverage (for example, X % of a region of a layer of build material should have agent Y, or a combination of agents Y and Z applied thereto). Such print materials may be related to or selected to provide an object property such as, for example, color, transparency, flexibility, elasticity, rigidity, surface roughness, porosity, conductivity, interlayer strength, density, and the like.

The actual location at which each print material (for example, a drop of an agent) should be applied, as specified in control data, may be determined using halftoning techniques.

For example, a set of voxels within object model data may have an associated print material coverage representation comprising a set of print material volume coverage (Mvoc) vectors. In a simple case, such a vector may indicate that X % of a given region of a three-dimensional space should have a particular agent applied thereto, whereas (100−X) % should be left clear of that agent. Mvocs may also specify combinations of agents which may be applied to a location, along with a probability that a particular combination should be applied.

The print material coverage representation may then provide the input for a 'halftoning' process to generate control data that may be used by an additive manufacturing system to produce a three-dimensional object. For example, it may be determined that, to produce specified object properties, 25% of a layer of build material (or of a portion of a layer) should have an agent applied thereto. The halftoning process determines where the drops of agent fall in order to provide 25% coverage. Techniques for halftoning include error diffusion, dithering using of halftone threshold matrices or masks (for example, based on blue or green noise distributions, or clustered dots or the like).

Such a representation may be used to form a gamut, which may be a convex gamut and may represent or estimate a maximum accessible gamut of the object generation apparatus (given predetermined constraints such as the amount of print agent which may be applied to any particular voxel, the print agents available, etc.).

FIG. 1 is an example of a method, which may be a method of determining a property mapping resource for use in additive manufacturing, and which may be computer implemented. The method comprises, in block 102, receiving (for example at a processor) a plurality of property parameter sets representing attainable property combinations in additive manufacturing. Each property parameter set may specify at least one property parameter and has an associated print material description. The print material description may for example comprise a print material coverage vector (e.g. an Mvoc, or an n-dimensional vector, when n is the number of print agents). For example, the association for each property parameter set may comprise a mapping derived from measurements of a test object generated using a particular print material description, as described above. In some examples, the print material description may be provided with the property parameter set. The property set may comprise any number of properties. In some examples, the property parameter sets are provided in an N dimensional matrix, where N is the number of properties for which property parameters are provided.

To consider a particular example, a set of properties comprising a strength and a color represented in an RGB color space may be associated with a print material vector based on print agents X and Y. This could be summarised as:

[S, R, G, B]: [X: a %, Y: b %, XY: c %, Z: d %] where S is a strength value, R is a red value, G is a green value and B is a blue value, XY represents a combination of agents X and Y being applied to a particular voxel, and Z indicates that neither agent is applied.

Block 102 may then comprise receiving a plurality of such property sets. The association may for example be via a mapping table or the like.

Block 104 comprises receiving a constraint of a first property of the property parameter sets. For example, the constraint may be that a particular property has a threshold value, for example a threshold strength, conductivity, resilience, density, brightness or the like.

Block 106 comprises determining a hull of a property mapping resource for use in determining additive manufacturing instructions for generating an object in which the first property meets the constraint. In examples, the property parameter sets are provided in an N dimensional matrix which is S×N in size, where S is the number of sets. Block 106 may comprise determining an N-dimensional convex hull of a property gamut based on the received matrix and/or determining a reduced N-dimensional convex hull satisfying the constraint. The property mapping resource may map between property parameter sets and print material descriptions.

Figure 2:
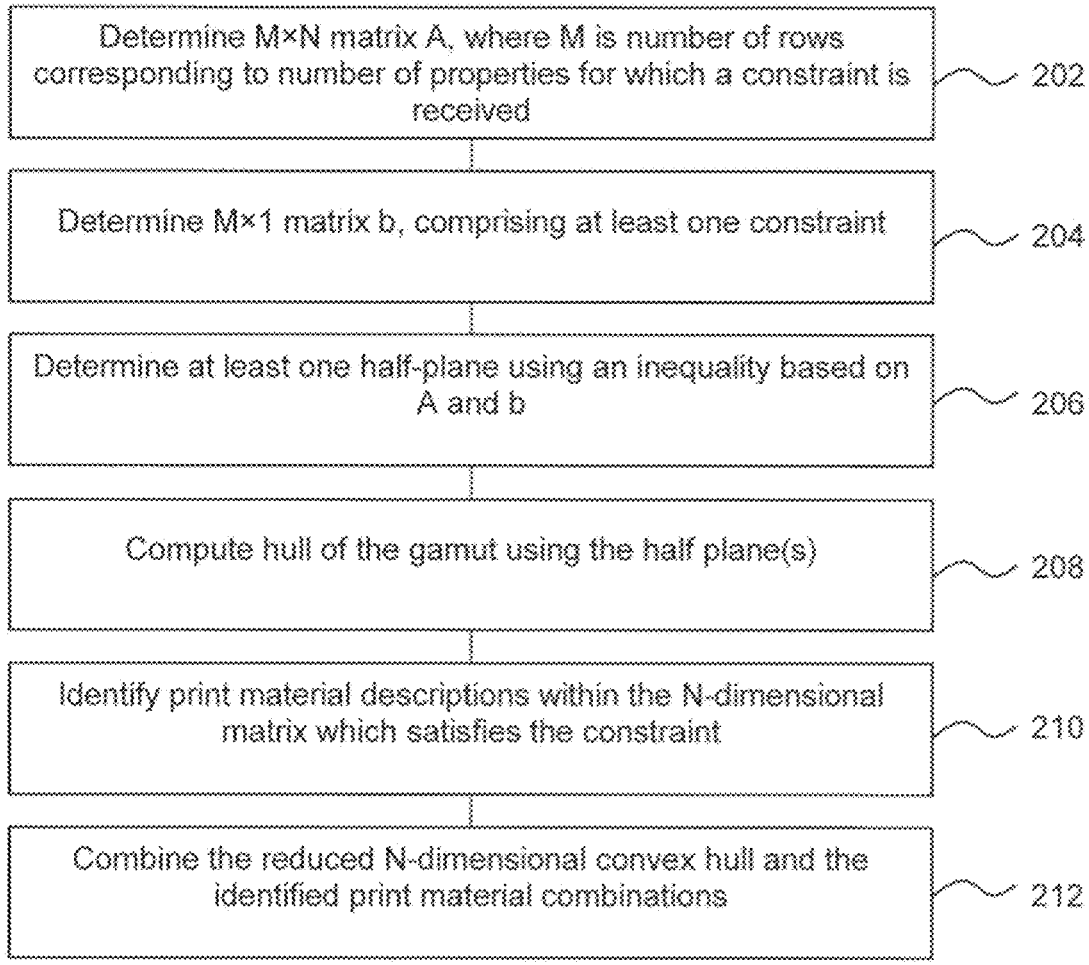
Figure 3A:
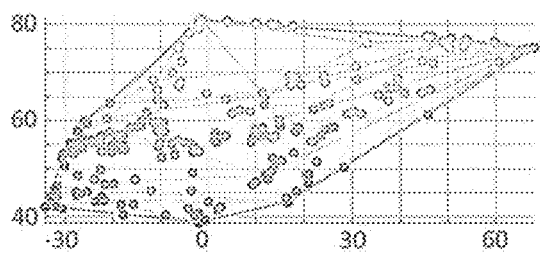
FIG. 3A-E are examples of N-dimensional convex hulls.
Figure 3A:
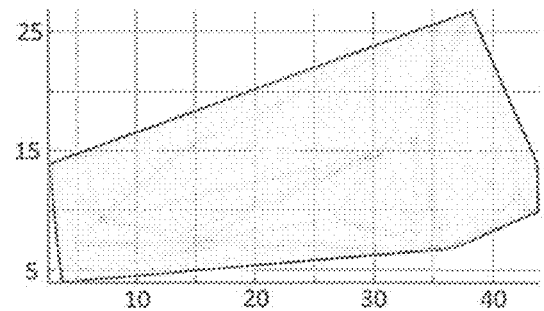
Figure 3B:
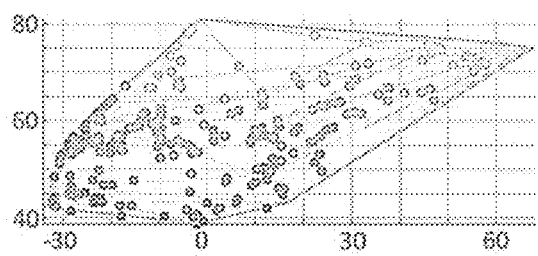
Figure 3B:
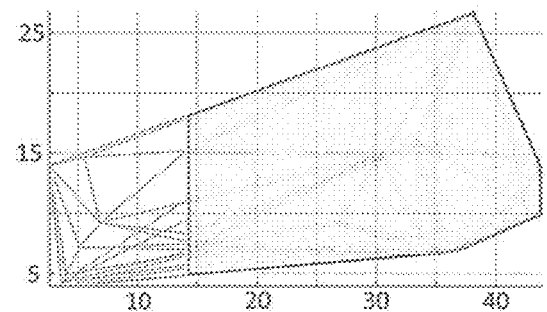
Figure 3C:
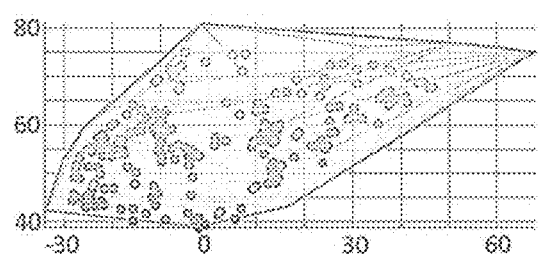
Figure 3C:
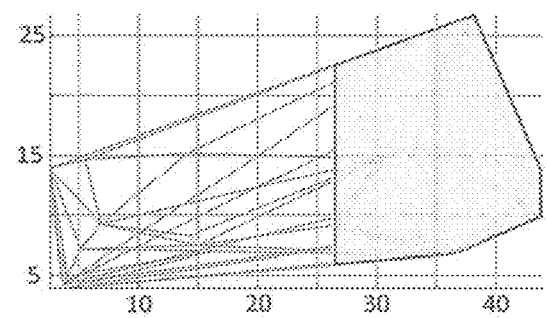
Figure 3D:
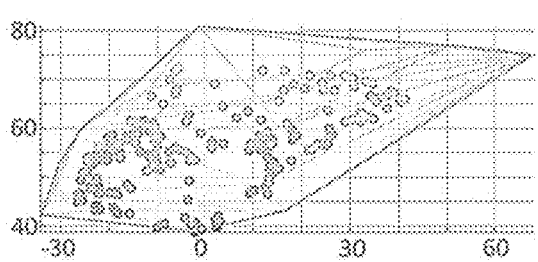
Figure 3D:
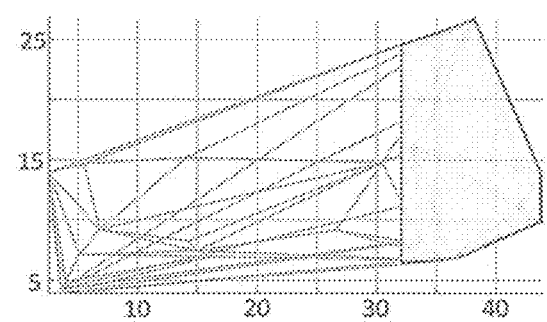
Figure 3E:
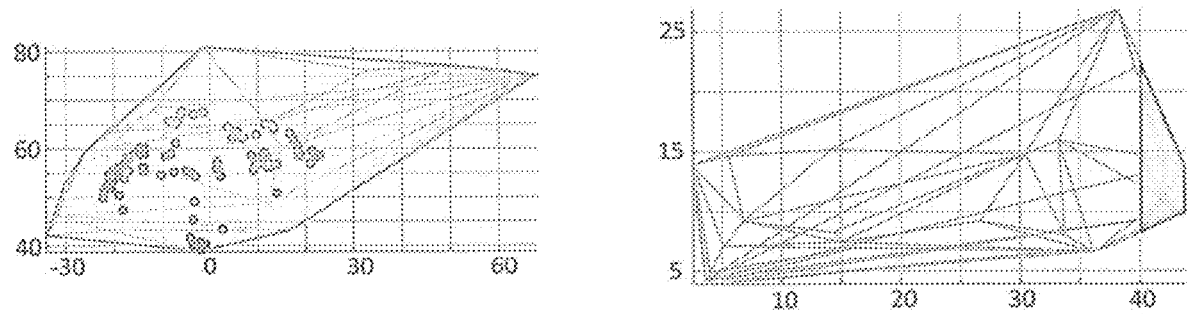

FIG. 2 is an example of a method of determining a property gamut satisfying the constraint.

Block 202 comprises determining an M by N matrix A, where M is a number of rows corresponding to the number of properties for which a constraint is received. Block 204 comprises determining an M by 1 matrix b, comprising at least one constraint and block 206 comprises determining at least one half-plane using an inequality based on A and b. A 'half plane' is any division of a space into two distinct sections. Block 208 comprises using the half plane(s) to compute the hull of the gamut.

Block 210 comprises identifying the print material descriptions within the N-dimensional matrix which satisfy the constraint. Block 212 comprises combining the reduced N-dimensional convex hull and the identified print material descriptions.

To consider a particular example in which the property set comprises a three dimensional (XYZ) color definition and strength S. In this example, therefore, property parameters comprise color parameters and a mechanical property parameter. In this example, the constraint is a constraint of the parameters of the mechanical property—i.e. a property related to the function and/or practicality of an object rather than its appearance. In practical cases, it may be intended to meet certain mechanical and/or functional constraints, for example such that the object is useful for its intended purpose (strong enough, buoyant enough, conductive enough, etc.). In this context, the method may be seen as a way of defining a gamut for object generation which allows an object to be as colourful as possible while meeting practical constraints.

From a measured set of properties (e.g. acquired from a set of test objects) which provides characterisation data, the 'full' object property gamut of the characterization data may be determined, for example by computing a 4D convex hull based on half planes (although vertices may be used in other examples).

The characterisation data may be stored in a matrix C=[X Y Z S]. An enclosing convex hull of C can be expressed as a set of half-plane intersections (or linear inequalities), with the dual representation of the extreme vertices of the convex hull, such that:

[A, b]=points2inequalities(C)

A and b are two matrices. A is M×4 and b is M×1 where each row constitutes a single inequality or half plane to which a constraint may be applied (i.e. M is the number of properties which may be constrained). Since the canonical form of convex hulls is in the form of Ax<=b, additional constraints (inequalities—rows of the matrices) can be added to A and b at this point (e.g. as described in blocks 202 and 204 above). For example, to add a constraint to the last dimension (break strength), then this may be achieved by adding a new inequality to the set [A, b] of the form:

A_=[0 0 0 1]
b_=constraint_value

If the constraint is for the values in the last dimension (break strength) to be "greater than or equal to" the constraint value (as compared to being "less than or equal to" the constraint value), then A_ takes the form of:

A_=−[0 0 0 1]

and −b_ comprises the constraint value. (i.e. the break strength is to be at least b_). It may be noted that the lower constraint may be expressed as Ax>=b but since Ax<=b is the canonical form, it is here expressed effectively in the form −Ax<=−b. If instead the constraint is to be a range (i.e. there is a lower constraint value and an upper constraint value), then two inequalities can be added:

A_(1, =:)=−[0 0 0 1]
b_(1)=−lower_constraint_value
A_(2, :)=[0 0 0 1]
b_(2)=upper_constraint_value This allows a new set of inequalities (half-planes) that combines A and A_ and b and b_ to be constructed (block 206). The new set will have M+1 rows (if a one-sided, rather than two-sided, inequality is added) or M+2 (if an interval, or two-sided, inequality is added). This set of inequalities is designated herein as Ac and bc.

The extreme vertices of this set of inequalities maybe computed—this is again the dual of the half-plane intersection representation, such that:

Cc=inequalities2points(Ac, bc)

The set Cc is a K×4 matrix and is then the new, constrained convex hull of a 'characterization set' (i.e. a set of measured property parameters associated with print material descriptions) where all samples meet the constraint(s) (block 208).

The measured characterization data from C that is inside Cc (i.e. the explicitly defined set of property parameter sets associated with print material descriptions which satisfies the inequalities [Ac,bc]) may then be included in hull (block 210). This is computed by evaluating Ac*C<=bc and for all cases where all inequalities [Ac, bc] hold, the original values from C are within the constraints.

The constrained gamut is therefore characterised by the hull Cc+a subset of the original values C that are inside the hull, and denoted Cco herein (block 212). This is the characterization set for which all values are within the constraint(s).

Taking the first 3 dimensions of this new set Cco results in the XYZ values for which the break strength S values satisfy the constraints( ).

A full 'property pipeline' mapping resource for mapping between intended properties and print materials may be thereby constructed. For example, this may mean that a particular color object data does not map to the closest possible color available to the object generation apparatus if that color is outside the constrained gamut. It may instead map to the closest color within the gamut (for example, on the surface thereof).

FIGS. 3A-E show examples of gamuts intended to show a color space on the left (b* being shown on the x axis and L* being shown on the y axis) and the right hand graph showing average break strength in MPa on the x axis and average break elongation as a percentage on the y axis. The points shown in the left hand charts mark the hull of the accessible color gamut in each case, shown within a full (but in FIGS. 3B-3E, no fully longer accessible) color gamut. FIGS. 3A-E show the result of the process of FIGS. 1 and 2 applied for a series of mechanical strength values starting with no constraint in FIG. 3A and then with constraints of a minimum strength of 14.2 MPa, 26.4 MPa, 32 MPa and 40 MPa for FIGS. 3B-3E respectively. As half planes are inserted and the constraint increases, the accessible color gamut hull become smaller. In other words, the range of colors available reduces as the strength specification becomes more onerous.

Figure 4:
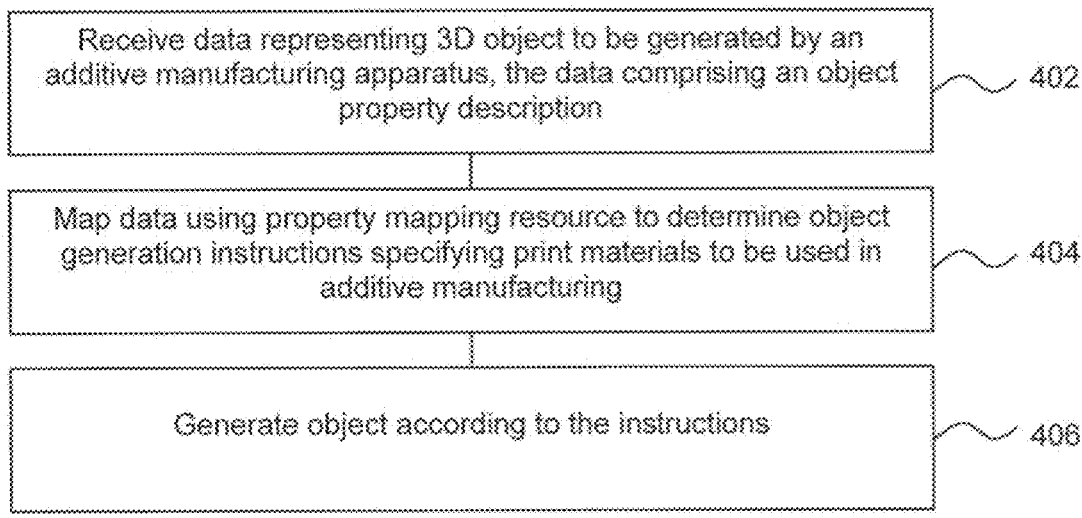
FIG. 4 is a flow chart of an example of generating a three-dimensional object.

FIG. 4 is an example of generating an object using a constrained gamut. Block 402 comprises receiving data representing a three-dimensional object to be generated by an additive manufacturing apparatus, the data comprising an object property description. For example, the object property description may describe, for each voxel, a combination of properties intended to result in an object to be generated. In some examples, object property descriptions may be associated with each of a plurality of voxels. In some examples, the data may for example comprise object model data and object property data. The object model data may define a three-dimensional geometric model of at least a portion of the model object, including the shape and extent of all or part of an object in a three-dimensional co-ordinate system, e.g. the solid portions of the object. The object model data may be generated, at least in part, by a computer aided design (CAD) application. Object property data may define at least one object property for the three-dimensional object to be generated. In one example, the object property data may comprise any or any combination of a color, flexibility, elasticity, rigidity, surface roughness, porosity, inter-layer strength, density, conductivity and the like for at least a portion of the object to be generated. The object property data may define multiple object properties for a portion or portions of an object. A given voxel may have associated data that indicates whether a portion of an object is present at that location. Object property data may comprise global and local object property data, e.g. certain object property values as defined in the object property data may be associated with each voxel that defines the object and/or certain object property values may be associated with a set of voxels, e.g. ranging from individual voxels to all voxels associated with the object. In one example, the data representing the three-dimensional object comprises a model of a three-dimensional object that has at least one object property specified at every location within the model, e.g. at every [x, y, z] co-ordinate.

The constrained property may be received, for example described within object property data, or may be set at an apparatus level such that the constraint will be imposed whether specified or not. This may reduce production of impractical objects. Block 404 comprises mapping the data using the property mapping resource to determine object generation instructions specifying print materials to be used in additive manufacturing.

The property mapping resource may be generated as described in FIG. 1 or FIG. 2 above. As noted above, in some example explicit mappings may be used. In some examples, the mapping maybe interpolated based on hull vertices and/or explicit mappings.

Block 406 comprises generating an object according to the instructions. In some examples there may be an intervening halftoning process applied to the data.

Figure 5:
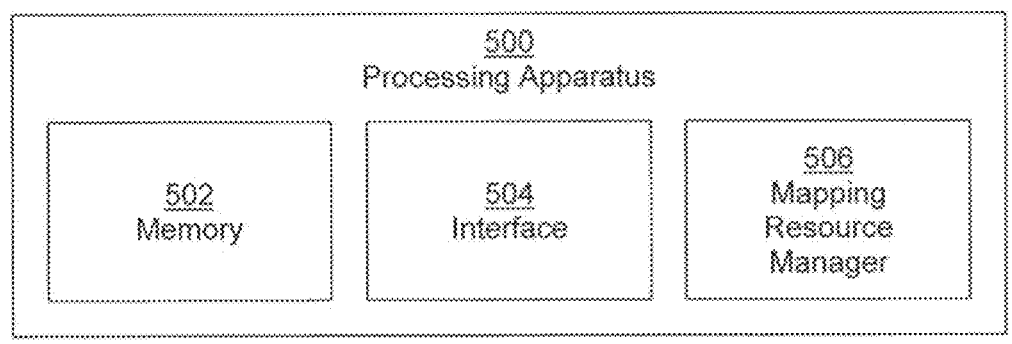
FIG. 5 is an example of processing apparatus.

FIG. 5 is an example of a processing apparatus 500 comprising a memory 502, an interface 504 and a mapping resource manager 506.

The memory 502 stores a plurality of attainable property parameter combinations in object generation. These may be associated with a mapping to print material descriptions for generating an object having the property combinations. In some examples, the property parameter combinations are known to be attainable in that test objects having that combination of property parameters have been generated. In some examples, the memory 502 stores a property mapping resource which associates at least one property in an object description with at least one print material description. Such a mapping resource may associate a property description with one or more print materials, or with a print instruction, each print instruction being to cause an object generation apparatus to print an object portion represented by a combination of voxels corresponding to the associated property description. In some examples, the mapping resource may be a look up table, or a database, or the like.

In use of the apparatus, the interface 504 receives an object property specification in relation to a property. For example this may be a constraint to be applied to at least one property. In some examples, the interface also receives data representing a three-dimensional object to be generated by an additive manufacturing apparatus, the data comprising an object property description.

The mapping resource manager 506 determines, for the set of property parameter combinations, a hull (which may be a convex hull) defining a property gamut. The mapping resource manager further determines a hull (which may be a convex hull) of a modified property gamut meeting the object property specification, and determines, based on the modified property gamut, a property mapping resource complying with the object property specification. For example, this may utilise at least some aspects of the methods described in relation to FIG. 1 and/or FIG. 2 above.

Figure 6:
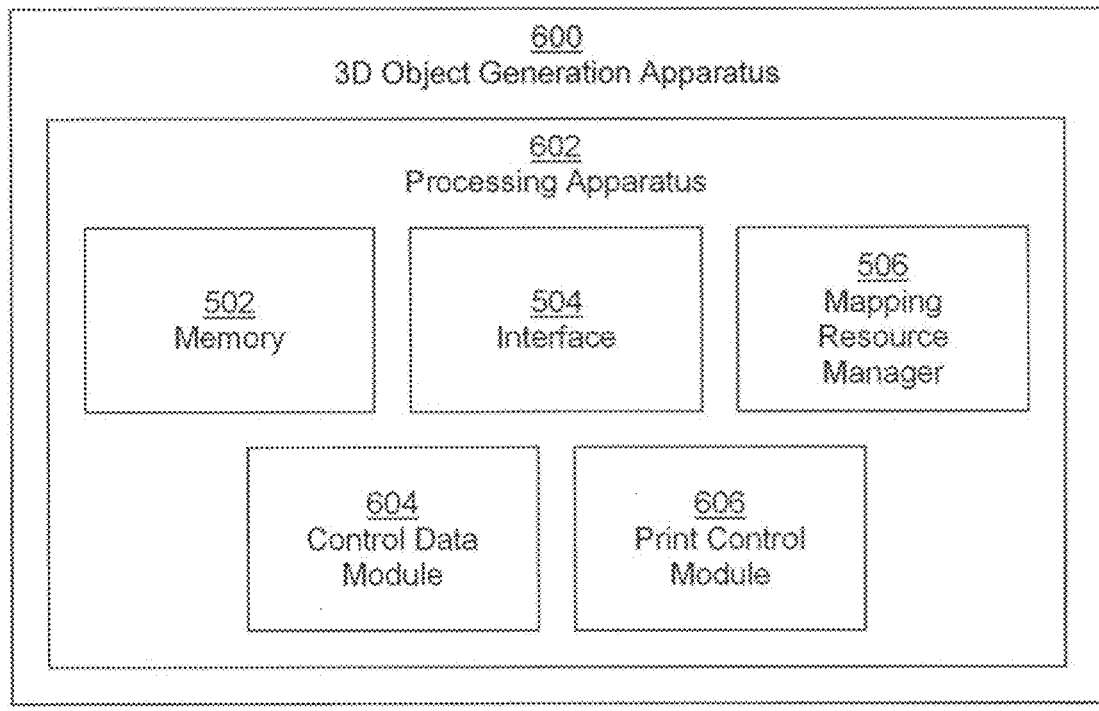
FIG. 6 is an example object generation apparatus.

FIG. 6 is an example of a three-dimensional object generation apparatus 600 which comprises processing apparatus 602 comprising, in addition to the memory 502, interface 504 and mapping resource manager 506 described in relation to FIG. 5, a control data module 604 and a print control module 606.

The control data module 604 generates control data to cause the object generation apparatus 600 to generate an object using the object property description and the property mapping resource. This data may be used directly to control an object generation apparatus to print an object. In some examples, generating control data may comprise applying halftoning to at least part of the print apparatus color description. Halftoning may for example comprise comparing a value in a print material coverage representation with a threshold values within a matrix, each threshold value representing a three-dimensional location (for example, an addressable pixel in a plane, or a voxel, or the like) to generate control data for printing a three-dimensional object based on the object property description. The control data may for example comprise a set of discrete print material choices for a pixel in a plane, wherein the discrete values across the area of the plane may be representative of proportions set out in a print material coverage representation.

The print control module 606 controls the three-dimensional object generation apparatus 600 to generate a three-dimensional object according to the control data. While in this example the processing apparatus 602 is part of the object generation apparatus 600, in other examples at least some components of the processing apparatus 602 may be in communication with an object generation apparatus, for example over a network rather than being local thereto.

Figure 7:
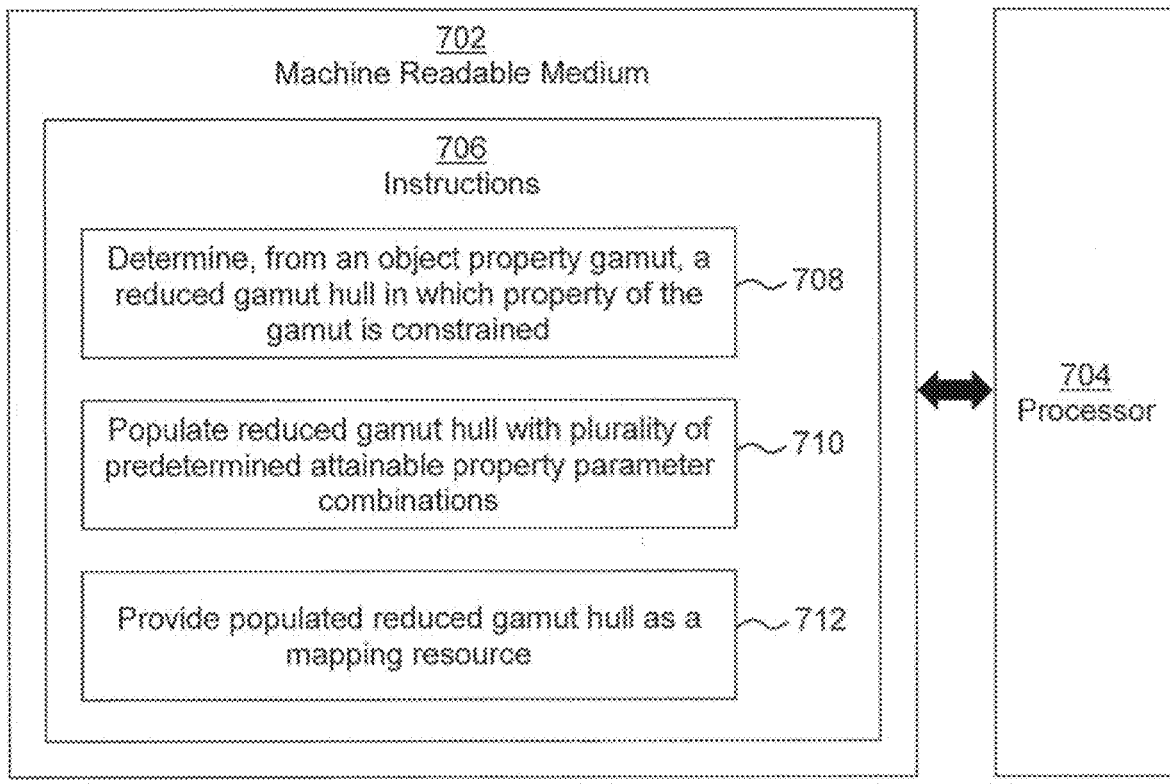
FIG. 7 is a simplified schematic of a processor and a computer readable medium according to one example.

FIG. 7 shows an example of a machine readable medium 702 in conjunction with a processor 704. The machine readable medium 702 stores instructions 706 which, when executed by the processor 704, cause the processor 704 to carry out certain processes. The instructions 706 comprise (i) instructions 708 to cause the processor 704 to determine, from an object property gamut, a reduced gamut hull in which a property of the gamut is constrained, (ii) instructions 710 to cause the processor 704 to populate the reduced gamut hull with a plurality of predetermined attainable property parameter combinations of object generation and (iii) instructions 712 to cause the processor 704 to provide the populated reduced gamut hull as a mapping resource.

In some examples, the machine readable medium 702 may further comprise instructions which, when executed by the processor 704, cause the processor 704 to determine the reduced gamut hull using interpolation of predetermined attainable property parameter combinations. For example, this may comprise interpolating vertices of a gamut satisfying the property constraint.

Examples in the present disclosure can be provided as methods, systems or machine readable instructions, such as any combination of software, hardware, firmware or the like. Such machine readable instructions may be included on a computer readable storage medium (including but is not limited to disc storage, CD-ROM, optical storage, etc.) having computer readable program codes therein or thereon.

The present disclosure is described with reference to flow charts and block diagrams of the method, devices and systems according to examples of the present disclosure. Although the flow diagrams described above show a specific order of execution, the order of execution may differ from that which is depicted. Blocks described in relation to one flow chart may be combined with those of another flow chart. It shall be understood that at least some blocks in the flow charts and block diagrams, as well as combinations of thereof can be realized by machine readable instructions.

The machine readable instructions may, for example, be executed by a general purpose computer, a special purpose computer, an embedded processor or processors of other programmable data processing devices to realize the functions described in the description and diagrams. In particular, a processor or processing apparatus (such as the processing apparatus 500, 602 or the processor 704 mentioned above) may execute the machine readable instructions. Thus functional modules of the apparatus and devices, such as the interface 504, mapping resource manager 506, control data module 604 and the print control module 606 may be implemented at least in part by a processor executing machine readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine readable instructions may also be stored in a computer readable storage (for example a memory 502 or a machine readable medium 702 as described above) that can guide the computer or other programmable data processing devices to operate in a specific mode.

Such machine readable instructions may also be loaded onto a computer or other programmable data processing devices, so that the computer or other programmable data processing devices perform a series of operation steps to produce computer-implemented processing, thus the instructions executed on the computer or other programmable devices provide a step for realizing functions specified by block(s) in the flow charts and/or in the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the above-mentioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. A method comprising:
receiving, at a processor, a plurality of property parameter sets representing attainable property combinations in additive manufacturing and being associated with print material descriptions, receiving, at the processor, a constraint of a first property of the property parameter sets; and determining, by the processor, a hull of a property mapping resource for use in determining additive manufacturing instructions for generating an object in which the first property meets the received constraint.

2. A method according to claim 1 wherein:
the property parameter sets are provided in an N-dimensional matrix, where N is a number of properties for which property parameters are provided; and
determining the property mapping resource comprises determining an N-dimensional convex hull of a property gamut and determining a reduced N-dimensional convex hull satisfying the constraint.

3. A method according to claim 2 wherein determining the reduced N-dimensional convex hull comprises:
determining an M by N matrix $A\_$, where M is a number of rows corresponding to a number of properties for which a constraint is received;
determining an M by 1 matrix $b\_$, comprising at least one constraint; and
determining a half-plane using an inequality based on $A\_$ and $b\_$.

4. A method according to claim 3 in which an upper and lower constraint is applied by determining two M by 1 matrices $b\_(1)$ and $b\_(2)$.

5. A method according to claim 3 further comprising computing vertices of the reduced N-dimensional convex hull.

6. A method according to claim 2 wherein:
determining the property mapping resource further comprising identifying the print material descriptions within the N-dimensional matrix which satisfy the constraint; and
combining the reduced N-dimensional convex hull and the identified print material descriptions.

7. A method according to claim 1 further comprising:
receiving data representing a three-dimensional object to be generated by an additive manufacturing apparatus, the data comprising an object property description; and
mapping the data using the property mapping resource to determine object generation instructions specifying print materials to be used in additive manufacturing.

8. A method according to claim 7, further comprising generating an object according to the instructions.

9. A method according to claim 1 in which the property parameter sets comprise a color parameter and a mechanical property parameter, and wherein the constraint is a constraint of a mechanical property parameter.

10. Processing apparatus comprising:
a memory storing a plurality of attainable property parameter combinations in object generation;
an interface to receive an object property specification in relation to a property; and
a mapping resource manager to:
determine, for the plurality of attainable property parameter combinations, a hull defining a property gamut;
determine a hull of a modified property gamut meeting the object property specification; and
determine, based on the modified property gamut, a property mapping resource complying with the object property specification.

11. Processing apparatus according to claim 10 wherein the interface is further to receive data representing a three-dimensional object to be generated by an additive manufacturing apparatus, the data comprising an object property description; and the processing apparatus further comprises a control data module to generate control data to cause an object generation apparatus to generate an object using the object property description and the property mapping resource.

12. Processing apparatus according to claim 11 further comprising a print control module, the print control module being to control a three-dimensional object generation apparatus to generate a three-dimensional object according to the control data.

13. Processing apparatus according to claim 10 in which the memory stores a property mapping resource which associates at least one property in an object description with at least one print material description.

14. A non-transitory machine readable medium storing instructions which, when executed by a processor, cause the processor to:
  determine, from an object property gamut, a reduced gamut hull in which a property of the object property gamut is constrained;
  populate the reduced gamut hull with a plurality of predetermined attainable property parameter combinations of object generation; and
  provide the populated reduced gamut hull as a mapping resource.

15. A non-transitory machine readable medium according to claim 14 storing further instructions which, when executed by a processor, cause the processor to determine the reduced gamut hull using interpolation of predetermined attainable property parameter combinations.

16. The method of claim 1, wherein the plurality of property parameter sets are mapped from measurements of a plurality of test objects.

17. The method of claim 1, wherein the plurality of property parameter sets comprise combinations of different properties for the generated object.

18. The method of claim 1, wherein a given property parameter set comprises the first property of the generated object and a second property of the generated object.

19. The method of claim 1, wherein the property mapping resource maps between the plurality of property parameter sets and the print material descriptions.

20. The method of claim 1, wherein the hull of the property mapping resource constrains a range of available combinations of the first property and a second property based on the received constraint.

* * * * *